United States Patent [19]
Snderford, Jr.

[11] Patent Number: 5,119,396
[45] Date of Patent: Jun. 2, 1992

[54] BINARY PHASE SHIFT KEYING MODULATION SYSTEM

[75] Inventor: H. Britton Snderford, Jr., New Orleans, La.

[73] Assignee: Axonn Corporation, La.

[21] Appl. No.: 572,468

[22] Filed: Aug. 27, 1990

[51] Int. Cl.⁵ .............................................. H04K 1/00
[52] U.S. Cl. ........................................ 375/1; 332/103; 375/67; 375/56; 375/83
[58] Field of Search .................. 375/1, 67, 56, 83; 332/103

[56] References Cited

U.S. PATENT DOCUMENTS 4,979,183  12/1990  Cowart ................................. 375/1
5,029,180  7/1991  Cowart ................................. 375/1

Primary Examiner—Thomas H. Tarcza
Assistant Examiner—David Cain
Attorney, Agent, or Firm—C. Emmett Pugh

[57] ABSTRACT

A low cost spread spectrum modulator for BPSK, or Binary Phase Shift Keying capable of outputting the high modulation rate and suppressed carrier output needed in spread spectrum systems. The present invention provides high quality BPSK modulation without the double balance mixers as required in the prior art, thereby dispensing with the necessity of complex transistor/potonciometer or diode/transformer arrangements. The present invention provides BPSK modulation utilizing only one transformer, which can be adjusted for carrier suppression and two transistors, allowing the present system to be driven from low power CMOS logic levels, yet producing eight db of gain.

8 Claims, 1 Drawing Sheet

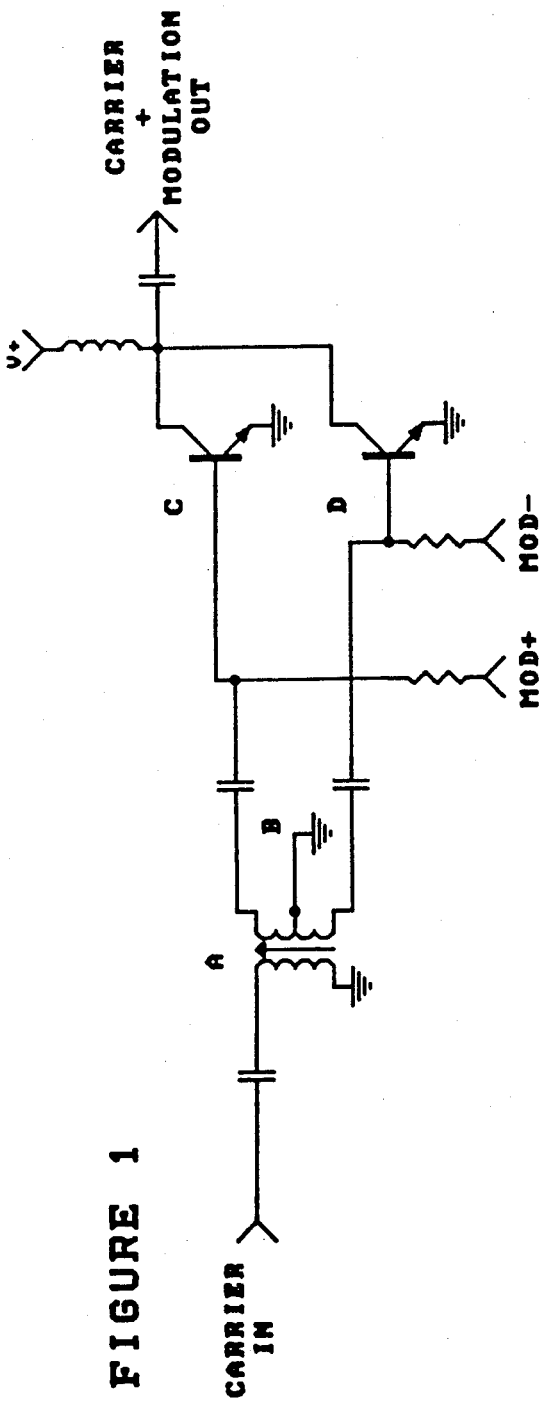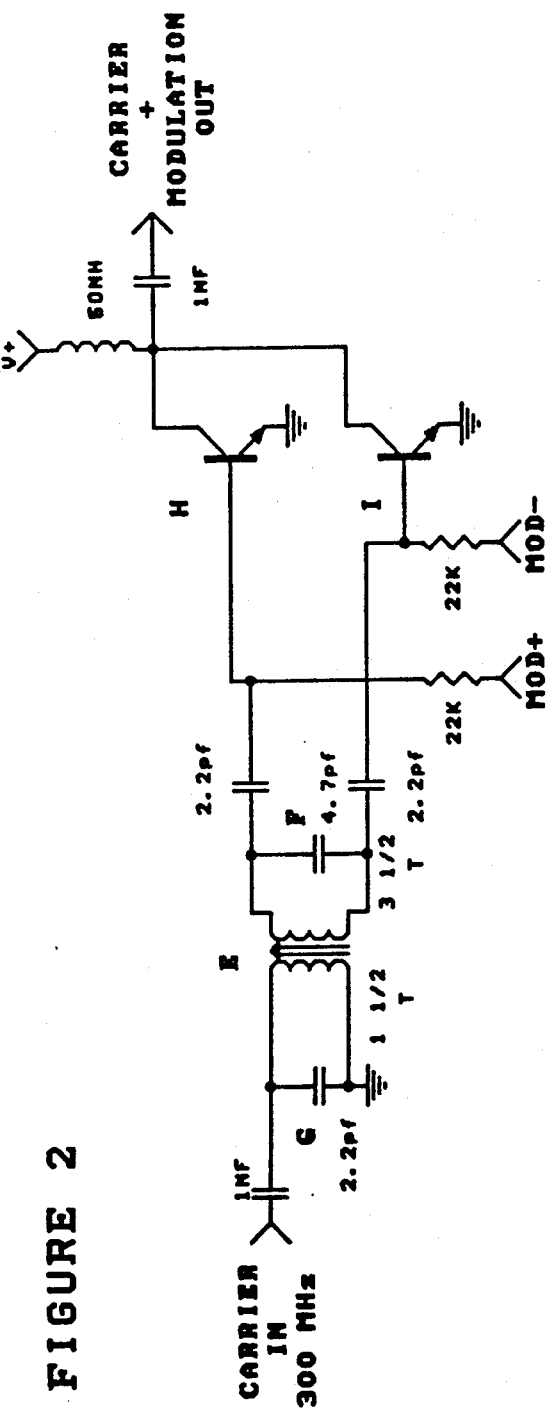

BINARY PHASE SHIFT KEYING MODULATION SYSTEM

BACKGROUND OF INVENTION

1. Field of Invention

The present invention relates to modulators, and more particularly to an improved spread spectrum BPSK, Binary Phase Shift Keying, Modulation system designed for providing gain, low cost and suppressed carrier output, as well as compatibility with CMOS low power logic modulation drive circuitry.

The present system teaches a new, superior, and less costly BPSK modulator than that contemplated by the prior art, providing a less complicated system while outputing increased gain over prior art modulators.

2. Prior Art and General Background

Previous spread spectrum BPSK modulators required conventional balance mixers to produce carrier suppression. These conventional modulators utilized either 1) a complex transistor array in conjunction with a transformer tunable with a potentiometer or 2) two center tapped transformers and four diodes, which arrangement required a high level drive circuit to modulate it, typically +7 to +15 dBM.

Besides the greater expense, increased complexity thereby contributing the probability of failure, and incompatibility with low power −10 dB CMOS logic drive circuitry, the prior art modulators typically produced on the order six dB of signal loss, resulting in considerably less satisfactory overall performance when compared to the present invention.

GENERAL, SUMMARY DISCUSSION OF THE INVENTION

A low cost spread spectrum modulator is an essential component of a commercially viable spread spectrum communications system. While a low cost, high performance modulator has not been contemplated until now, the present invention describes the ideal modulator, designed specifically for Binary Phase Shift Keying or BPSK.

The present invention is designed to provide a low cost, efficient, quality and reliable modulation system having sufficiently high BPSK modulation rate, coupled with the suppressed carrier output needed in spread spectrum communication systems and the like.

Unlike the prior art, which required balance mixers of the sort discussed in the background section supra, the present invention provides a BPSK modulator utilizing only one transformer having the capability of adjusting for maximum carrier suppression, in conjunction with two bipolar transistors, which allow the modulator to be driven from the low power logic levels found in CMOS circuitry −10 dBM. The present invention in its preferred embodiment produces eight dB of gain, much superior in performance over the prior art, which performs at a six dB signal loss.

It is thus an object of the present invention to provide a low cost, high quality BPSK modulator compatible for use in spread spectrum-tipe communications systems.

It is another object of the present invention to provide a BPSK modulation system which is compatible with low power logic input, such as that driven by CMOS circuitry.

It is still another object of the present invention to provide a BPSK modulator which utilizes a single transformer and two transistors, adjusts for carrier suppression, and provides eight db+ of gain.

BRIEF DESCRIPTION OF THE DRAWINGS

For a further understanding of the nature and objects of the present invention, reference should be had to the following detailed description, taken in conjunction with the accompanying drawings, in which like parts are given like reference numerals, and wherein:

FIG. 1 is a Schematic Illustration of the preferred embodiment of the BPSK Modulator of the present invention.

FIG. 2 is Schematic Illustration of an alternative, less costly embodiment of the BPSK Modulator of FIG. 1.

DETAILED DESCRIPTION OF THE PREFERRED, EXEMPLARY EMBODIMENT(S)

The described modulator uses only one transformer which also adjusts for carrier suppression and two transistors, and as such can be driven from low power CMOS logic levels producing a full eight dB of gain.

BPSK modulation seeks to alternate a carrier between a 0 degree phase shift and a 180 degree phase shift, the phase shift of the carrier providing the modulation. As illustrated in Figure CKT 1 of the present invention, the outputs of the transformer "A", when the center tap "B" is grounded, are inherently at opposite phases, 0 degrees and 180 degrees.

Transistor C and D can then be alternately selected by biasing the MOD+ or MOD− inputs to on. Thus either the 0 degree phase shift or 180 degree phase shift can be selected which provides BPSK modulation with 8 dB of gain.

An alternative embodiment to the present invention obviates with the need for the costly center tap in the transformer, further simplifying the present design. This circuit is based upon the premise that an inductor at resonance has outputs 180 degrees out of phase, producing 0 and 180 degrees outputs. The 0 degree and 180 degree outputs are selected using the same MOD−, MOD+ biasing as described above.

Through extensive experimentation, the present inventor has determined that either tight (>0.6 coupling coefficient) or loose (<0.3 coupling coefficient) coupling of the transformer windings can be used to produce suitable 0 degree and 180 degree phase shifts for BPSK modulation.

As illustrated in FIG. 2, in the embodiment implementing the loosely coupled transformer, both capacitors G and F must be configured to resonate in conjunction with the carrier frequency to be modulated. The resonate point in this circuit may be fine adjusted by varying the transformer's inductance by turning the tunable core or slug of transformer E.

In a tightly coupled transformer, capacitor G can be eliminated and transformer E must be only resonate with capacitor F. Fine tuning is again achieved by adjusting the slug or core of transformer E. The value of capacitor F must be such that it resonates with transformer E at the frequency to be modulated.

Both embodiments of the invention perform identically when properly configured and can produce excellent BPSK spread spectrum modulation with adjustable carrier suppression.

As discussed above, the value of the resonate capacitors to be used is dependent upon the transformer inductance and carrier frequency. In the present invention, if a 1½ primary turn to 2½ secondary turn transformer is used with a carrier frequency of 300 MHz, then practical resonate capacitor values are 2.2 to 6.8 pf for G and E. The series coupling capacitors must be relatively small to minimize coupling of transistor base to collector capacitance. Practical values are from 2.2 to 8.2 pf.

The transformer turns ratio is selected to match the impedance of the driving carrier CKT to the input impedance of the gain/phase selection transistors.

Since FIG. 2 must be in resonance to function, the overall Q of the CKT and transformer coupling can be chosen to optimize performance as a tuned filter. Q is primarily effected by the transformer slug loss. Further loosely coupled transformers provide optimum filtering characteristics. This function can filter out undesirable harmonics from previous RF stages eliminating otherwise required additional filter components.

The overall 8 dB of gain realized is a product of sums of both gain and losses of the entire circuit. The transformer produces 2 to 4 dB of loss, the coupling capacitors produce 1 dB of loss, the transistors provide 12 to 13 dB of gain. The average circuit gain is determined as the minimum overall gain $(12-4-1)=7$ dB to a maximum overall gain of $(13-2-1)=10$ dB of gain.

The embodiment(s) described herein in detail for exemplary purposes are of course subject to many different variations in structure, design, application and methodology. Because many varying and different embodiments may be made within the scope of the inventive concept(s) herein taught, and because many modifications may be made in the embodiment(s) herein detailed in accordance with the descriptive requirements of the law, it is to be understood that the details herein are to be interpreted as illustrative and not in a limiting sense.

What is claimed is:

1. A BPSK Modulator circuit, comprising:
   a transformer, said transformer further comprising first induction means having a carrier input leg and a grounded output leg, second induction means having first and second leg outputs, and a grounded center tap leg juxtaposed said first and second induction means, said transformer configured such that said first and second leg outputs of said second induction means modulates at opposite phases of 180 and 0 degrees, forming "MOD+" and "MOD−", respectively, relative a carrier signal supplied to said carrier input of said first induction means;
   first and second phase selection means configured to modulate via input of said of said first and second outputs of said second induction means, said first and second phase selection means further comprising first and second load bipolar transistors or their equivalent, respectively, each having an emitter, a grounded collector, and a base or the equivalent, said base of said first transistor in circuit with said first output of said second inductor, receiving said "MOD+", said base of said second transistor in circuit with said second output of said second inductor, receiving said "MOD−".

2. A BPSK Modulator circuit having a tunable slug or core to adjust carrier suppression in a spread spectrum system, comprising:
   a transformer, said transformer further comprising first induction means having a carrier input leg and a grounded output leg, second induction means having first and second leg outputs, and a tunable slug or core juxtaposed said first and second induction means, said transformer configured such that said first and second leg outputs of said second induction means modulates at opposite phases of 180 and 0 degrees, forming "MOD+" and "MOD−", respectively, relative a carrier signal supplied to said carrier input of said first induction means;
   first and second phase selection means configured to modulate via input of said first and second leg outputs of said second induction means, said first and second phase selection means further comprising first and second load bipolar transistors, respectively, each having an emitter, a grounded collector, and a base, said base of said first transistor in circuit with said first output leg of said second inductor, receiving said "MOD+", said base of said second transistor in circuit with said second output leg of said second inductor, receiving said "MOD−".

3. A BPSK Modulator circuit utilizing a loosely coupled transformer to adjust carrier suppression in a spread spectrum system, comprising:
   a transformer, said transformer further comprising first induction means having a carrier input leg and a grounded output leg, second induction means loosely coupled with said first induction means, said second induction means having first and second leg output, said transformer configured such that said first and second leg outputs of said second induction means modulates at opposite phases of 180 and 0 degrees, forming "MOD+" and "MOD−", respectively, relative a carrier signal supplied to said carrier input of said first induction means;
   first and second capacitors, said first capacitor in parallel circuit with said carrier input leg and grounded output leg of said first induction means, said second capacitor in parallel circuit with said first and second leg outputs of said second induction means,
   first and second phase selection means configured to modulate via input of said first and second outputs of said second induction means, said first and second phase selection means further comprising first and second load bipolar transistors, respectively, each having an emitter, a grounded collector, and a base, said base of said first transistor in serial circuit with said first leg output of said second inductor, receiving said "MOD+", said base of said second transistor in serial circuit with said second leg output of said second inductor, receiving said "MOD−".

4. The BPSK Modulation System of claim 3 wherein there is further included a tunable slug or core is juxtaposed said first and second inductors.

5. The BPSK Modulation System of claim 4, wherein there is further included resonator capacitor means in parallel circuit with said first and said second leg outputs of said second induction means, said resonator capacitor transformer coupling means configured to provide band pass filtering for previous stage harmonic suppression.

6. A BPSK Modulator circuit having a tightly coupled transformer having no center tap and a single parallel resonate capacitor on the secondary to provide BPSK modulation, comprising:

a transformer, said transformer further comprising first induction means having a carrier input leg and a grounded output leg, second induction means tightly coupled to said first induction means, said second induction means having first and second leg outputs, said transformer configured such that said first and second leg outputs of said second induction means modulates at opposite phases of 180 and 0 degrees, forming "MOD+" and "MOD−", respectively, relative a carrier signal supplied to said carrier input of said first induction means;

band pass filter means for filtering harmonic suppression from said transformer, said band pass filter means further comprising a resonate capacitor in parallel circuit with said first and second leg outputs of said second induction means;

first and second phase selection means configured to modulate via input of said first and second outputs of said second induction means, said first and second phase selection means further comprising first and second load bipolar transistors, respectively, each having an emitter, a grounded collector, and a base, said base of said first transistor in circuit with said first leg output of said second inductor, receiving said "MOD+", said base of said second transistor in circuit with said second output of said second inductor, receiving said "MOD−".

7. The BPSK Modulation System of claim 6, wherein said system further comprises adjustment means for adjusting carrier suppression, said adjustment means further comprising a tunable slug or core juxtaposed said first and second induction means.

8. The BPSK Modulation System of claim 6, wherein there is further included resonator capacitor means in parallel circuit with said first and said second leg outputs of said second induction means, said resonator capacitor means configured to provide band pass filtering for previous stage harmonic suppression.

* * * * *